(12) United States Patent
Shin

(10) Patent No.: US 8,154,948 B2
(45) Date of Patent: Apr. 10, 2012

(54) METHOD OF OPERATING NONVOLATILE MEMORY DEVICE

(75) Inventor: Beom Ju Shin, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 245 days.

(21) Appl. No.: 12/701,877

(22) Filed: Feb. 8, 2010

(65) Prior Publication Data
US 2010/0284230 A1    Nov. 11, 2010

(30) Foreign Application Priority Data

May 11, 2009    (KR) .................. 10-2009-0040713

(51) Int. Cl.
   *G11C 8/00* (2006.01)
(52) U.S. Cl. ............... 365/230.08; 365/189.05; 365/203
(58) Field of Classification Search ............ 365/230.08, 365/203, 189.05, 189.15, 189.16
See application file for complete search history.

(56) References Cited

U.S. PATENT DOCUMENTS

| | | | | |
|---|---|---|---|---|
| 6,798,697 | B2 * | 9/2004 | Hosono et al. | 365/185.12 |
| 7,180,783 | B2 * | 2/2007 | Kim et al. | 365/185.22 |
| 7,359,245 | B2 * | 4/2008 | Kim et al. | 365/185.18 |
| 7,518,945 | B2 * | 4/2009 | Kim | 365/230.08 |

FOREIGN PATENT DOCUMENTS

KR    1020090026502    3/2009

OTHER PUBLICATIONS

Notice of Allowance issued from Korean Intellectual Property Office on Apr. 28, 2011.

* cited by examiner

*Primary Examiner* — Son Dinh
(74) *Attorney, Agent, or Firm* — IP & T Group LLP

(57) ABSTRACT

A method of operating a nonvolatile memory device includes supplying a variable voltage of a first voltage level to a selected page buffer and supplying the variable voltage to a first bit line, coupled to a selected memory cell selected for data reading, for a first time period, cutting off the supply of the variable voltage to the first bit line, after the first time period, and precharging the first bit line to a second voltage level through a sense node of the selected page buffer, which is in a precharge state, evaluating a voltage of the first bit line, after the precharging of the first bit line, so that the voltage of the first bit line is shifted according to a program state of the selected memory cell, and sensing the voltage of the evaluated first bit line and latching data in the selected memory cell.

11 Claims, 9 Drawing Sheets

METHOD OF OPERATING NONVOLATILE MEMORY DEVICE

CROSS-REFERENCE TO RELATED APPLICATION

Priority to Korean patent application number 10-2009-0040713 filed on May 11, 2009, the entire disclosure of which is incorporated by reference herein, is claimed.

BACKGROUND

Exemplary embodiments relate to a method of operating a nonvolatile memory device and, more particularly, to a method of operating a nonvolatile memory device, which is capable of reducing a bit line precharge time when data are read.

A nonvolatile memory device may have the advantages of random access memory (RAM), such as enabling the writing and erasure of data, and read only memory (ROM), such as retaining data even without the supply of power, and so has recently been widely used for the storage media of portable electronic devices, such as digital cameras, personal digital assistants (PDAs), and MP3 players.

The nonvolatile memory device may include a memory cell array, a row decoder, a page buffer unit, etc. The memory cell array includes a plurality of word lines elongated in rows, a plurality of bit lines elongated in columns, and a plurality of cell strings corresponding to the respective bit lines.

Memory cells may have varying threshold voltages according to their program states. It is ideal that the memory cells have the same threshold voltage according to the state of data to be stored. However, when a program operation is actually performed on the memory cells, the threshold voltages of the memory cells have probability distributions in some regions because of various external environments, such as the device characteristics and the coupling effect.

When reading programmed data, the nonvolatile memory device may consecutively perform operations, such as bit line precharge, bit line evaluation, sense, and discharge.

The bit line precharge operation is performed to precharge a bit line, coupled to a selected memory cell, to a desired voltage level so as to read data. The bit line evaluation operation is performed to change a precharged bit line according to the program state of a selected memory cell.

The sense operation is performed to sense the voltage of a bit line changed through an evaluation operation and to latch the sensed voltage. The discharge operation is performed to discharge the voltage of a bit line.

The bit line precharge operation may have the longest execution time in the data read process. This is because a bit line is precharged to a desired voltage level using the sense node of a page buffer.

BRIEF SUMMARY

Exemplary embodiments relate to a method of operating a nonvolatile memory device, which is capable of reducing a data read time by reducing a bit line precharge time taken when data are read.

A method of operating a nonvolatile memory device according to an embodiment of this disclosure includes providing page buffers each coupled to one or more bit lines, supplying a variable voltage of a first voltage level to a selected page buffer among the page buffers and supplying the variable voltage to a first bit line, coupled to a selected memory cell selected for data reading, for a first time period, cutting off the supply of the variable voltage to the first bit line, after the first time period, and precharging the first bit line to a second voltage level through a sense node of the selected page buffer, which is in a precharge state, evaluating a voltage of the first bit line, after the precharging of the first bit line, so that the voltage of the first bit line is shifted according to a program state of the selected memory cell, and sensing the voltage of the first bit line, after the evaluating of the voltage of the first bit line, and latching data in the selected memory cell.

Furthermore, the supply of the variable voltage to a second bit line unselected for data reading is cut off, during the first time period.

Moreover, the variable voltage of a ground voltage level is supplied, and the second bit line is supplied with the variable voltage, after the first time period.

Still further, the sense node of the page buffer and the first bit line are disconnected, during the first time period.

The first voltage level is higher than the second voltage level.

Another method of operating a nonvolatile memory device according to an embodiment of this disclosure includes providing page buffers each coupled to one or more bit lines, precharging a sense node of one of the page buffers, coupling the sense node to a first bit line to which a selected memory cell selected for data reading is coupled, and precharging the first bit line coupled to the sense node and simultaneously supplying the first bit line with a variable voltage of a first voltage level for a first time period, thereby obtaining a precharged first bit line having a second voltage level, evaluating a voltage of the precharged first bit line, so that the voltage of the precharged first bit line is shifted according to a program state of the selected memory cell, and sensing the voltage of the precharged first bit line, after the evaluating of the voltage of the precharged first bit line, and latching data in the selected memory cell.

The first time period is shorter than a time utilized for the precharging of the first bit line.

The variable voltage is supplied when the precharging of the first bit line is started, and the supplying of the variable voltage is stopped after a lapse of the first time period.

After a lapse of a certain time since the precharging of the bit line is started, the supply of the variable voltage begins.

After the first time period, the variable voltage is changed to a ground voltage level and the variable voltage of the ground voltage level is supplied to a second bit line unselected for data reading.

The first voltage level is higher than the second voltage.

DESCRIPTION OF EMBODIMENTS

Hereinafter, some embodiments of the present disclosure will be described in detail with reference to the accompanying drawings. The figures are provided to allow those having ordinary skill in the art to understand the scope of the embodiments of the disclosure.

Figure 1:
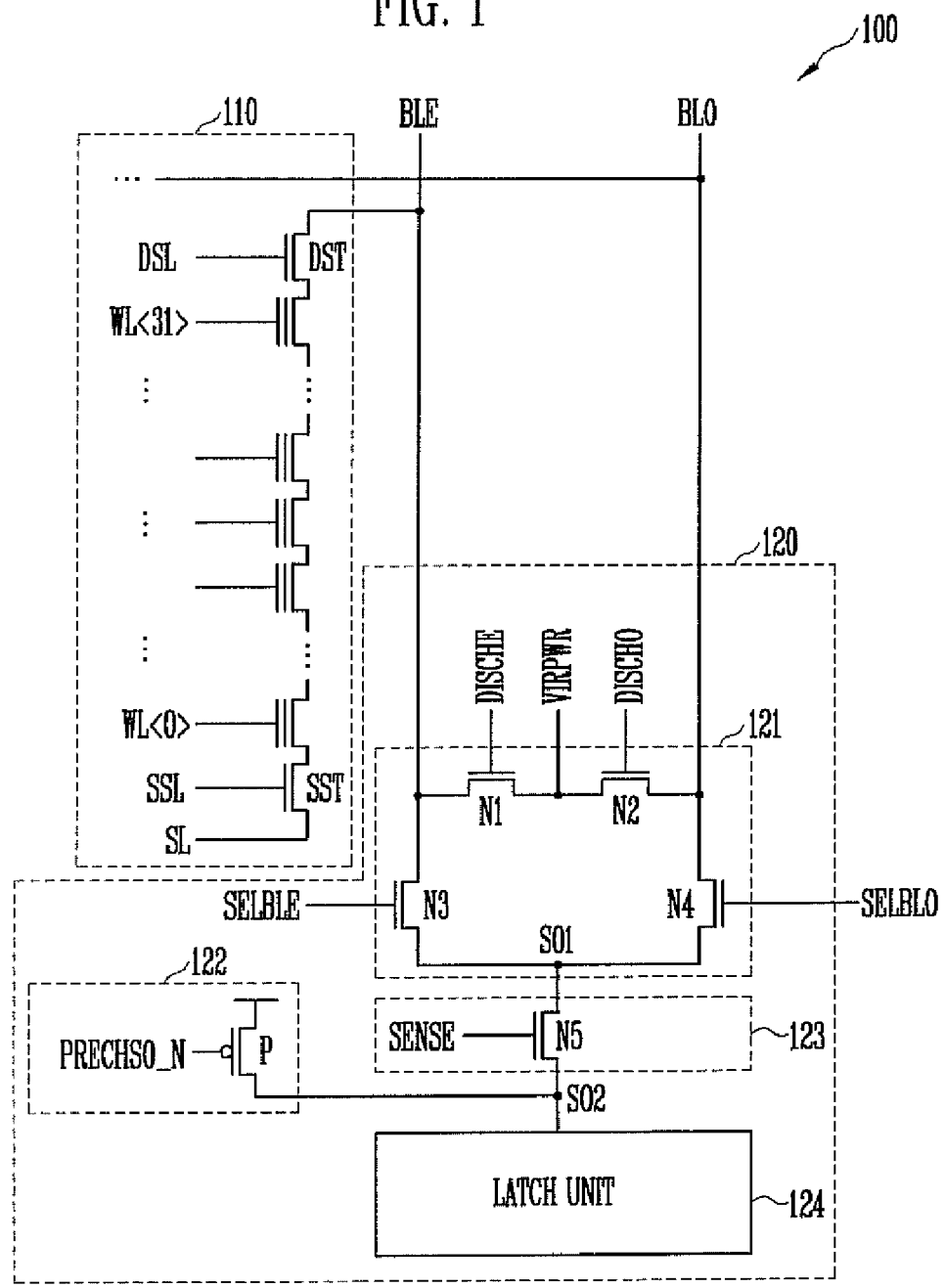
FIG. 1 shows a nonvolatile memory device according to an embodiment of this disclosure.

FIG. 1 shows a nonvolatile memory device according to an embodiment of this disclosure.

Referring to FIG. 1, the nonvolatile memory device 100 according to the embodiment of this disclosure includes a memory cell array 110 and a page buffer 120.

Only portions for describing the embodiment of this disclosure are illustrated in FIG. 1 for simplicity purposes.

The memory cell array 110 includes a number of memory cells. The memory cells are coupled together by bit lines and word lines. Only one cell string coupled to one bit line is illustrated in FIG. 1 for simplicity. The memory cell array 110 includes a number of the cell strings coupled to a number of the respective bit lines.

The cell string includes a drain select transistor DST, a source select transistor SST, and a number of the memory cells.

A number of the memory cells are coupled in series between the drain select transistor DST and the source select transistor SST. A word line WL is coupled to each of the memory cells. The nonvolatile memory device 100 according to the embodiment of this disclosure is illustrated to include 32 memory cells coupled together in series in one cell string. Accordingly, $0^{th}$ to thirty-first word lines WL<0> to WL<31> are coupled to the respective gates of the 32 memory cells.

The page buffer 120 is coupled to one or more bit lines. In the embodiment of this disclosure, a pair of the bit lines, including an even bit line BLe and an odd bit line BLo, are coupled to the page buffer 120. A plurality of the page buffers 120, such as that shown in FIG. 1, is included depending on the number of the pairs of bit lines.

The page buffer 120 includes a bit line selection unit 121, a precharge unit 122, a sense unit 123, and a latch unit 124.

The bit line selection unit 121 is configured to select the even bit line BLE or the odd bit line BLO and to supply a selected bit line with a variable voltage VIRPWR or is configured to couple a selected bit line with a first sense node SO1.

The precharge unit 122 is configured to precharge a second sense node SO2. The sense unit 123 is configured to sense the voltage of a bit line coupled thereto through the first sense node SO1 and to change the voltage level of the second sense node SO2.

The latch unit 124 is configured to receive data to be programmed into a selected memory cell and to provide the received data to the second sense node SO2 or is configured to latch stored data in a selected memory cell when data are read.

The bit line selection unit 121 includes first to fourth NMOS transistors N1 to N4. The precharge unit 122 includes a PMOS transistor. The sense unit 123 includes a fifth NMOS transistor N5.

The first and second NMOS transistors Ni, N2 are coupled in series between the even bit line BLE and the odd bit line BLO. An even discharge control signal DISCHE is inputted to the gate of the first NMOS transistor N1, and an odd discharge control signal DISCHO is inputted to the gate of the second NMOS transistor N2.

The variable voltage VIRPWR is inputted to a commonly shared node between the first and second NMOS transistors Ni, N2. The variable voltage VIRPWR can be changed into a power source voltage VCC or a ground voltage VSS according to the operation.

The third NMOS transistor N3 is coupled between the even bit line BLE and the first sense node SO1, and the fourth NMOS transistor N4 is coupled between the odd bit line BLO and the first sense node SO1.

An even bit line selection signal SELBLE is inputted to the gate of the third NMOS transistor N3, and an odd bit line selection signal SELBLO is inputted to the gate of the fourth NMOS transistor N4.

The fifth NMOS transistor N5 is coupled between the first sense node SO1 and the second sense node SO2. A sense signal SENSE is inputted to the gate of the fifth NMOS transistor N5.

The PMOS transistor P is coupled between the power source voltage and the second sense node SO2. A precharge control signal PRECHSO_N is inputted to the gate of the PMOS transistor P.

The latch unit 124 includes a number of latch circuits. The latch circuits are each coupled to the second sense node SO2.

A data read operation in the nonvolatile memory device 100 is described below.

Figure 2:
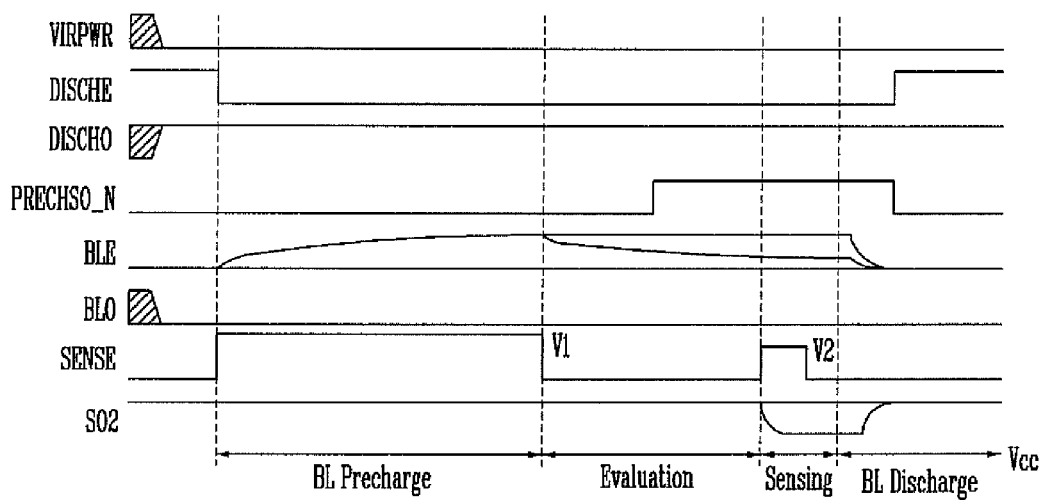
FIG. 2 is a timing diagram illustrating a data read operation in an exemplary nonvolatile memory device.

FIG. 2 is a timing diagram illustrating the data read operation in an exemplary nonvolatile memory device.

Referring to FIG. 2, in general, to read data, a bit line is precharged (BL precharge) and evaluated (Evaluation). Next, the voltage level of the line is sensed (Sensing), and the bit line is discharged (BL discharge).

The bit line precharge operation is described below. In the case in which the even bit line BLE is selected, the variable voltage VIRPWR of a ground voltage (VSS) level is inputted, the even discharge control signal DISCHE of a low level is inputted, and the odd discharge control signal DISCHO of a high level is inputted.

Thus, the first NMOS transistor N1 is turned off, and the second NMOS transistor N2 is turned on. Since the second NMOS transistor N2 is turned on, the voltage level of the unselected odd bit line BLO becomes a ground voltage (VSS) level, The precharge control signal PRECHSO_N of a low level is applied to turn on the PMOS transistor P, thereby precharging the second sense node SO2 to the power source voltage (VCC) level.

Next, in the state in which the even bit line selection signal SELBLE is turned on, the sense signal SENSE of a first voltage level is inputted, and so voltage precharged in the second sense node SO2 is transferred to the even bit line BLE. The even bit line BLE is precharged to a desired target voltage through the above process.

As described above, the time that it takes to couple the second sense node SO2 and the bit line together and to precharge the bit line occupies a very long time in a total time utilized to read data.

To reduce the time utilized to precharge the bit line, this disclosure presents the following method of precharging a bit line.

Figure 3:
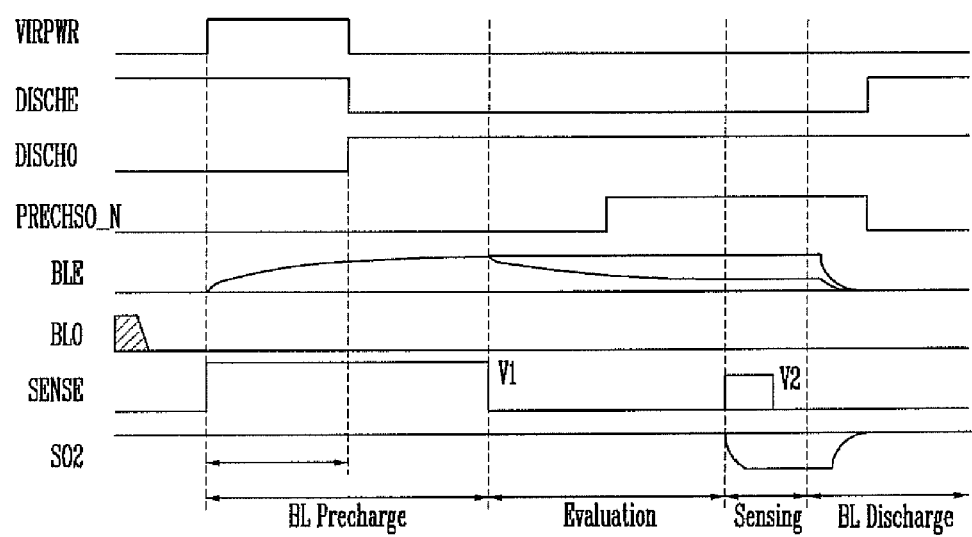
FIG. 3 is a timing diagram illustrating an operation of the nonvolatile memory device according to a first embodiment of this disclosure.

FIG. 3 is a timing diagram illustrating an operation of the nonvolatile memory device according to a first embodiment of this disclosure.

As shown in FIG. 3, to reduce the bit line precharge time, the method of operating the nonvolatile memory device according to the present embodiment adopts an over-driving method of precharging a bit line using the variable voltage VIRPWR in some of the bit line precharge time (PB Precharge).

The over-driving method is used to precharge a bit line to a voltage more than a target voltage, which is a desired voltage that the bit line is intended to be precharged to. In the embodiment of this disclosure, the variable voltage VIRPWR of a power source voltage (VCC) level is inputted.

That is, as shown in FIG. 3, when the bit line BLE begins being precharged, the variable voltage VIRPWR of a power source voltage (VCC) level is inputted, the even discharge control signal DISCHE of a high level is inputted, and the odd discharge control signal DISCHO of a low level is inputted.

In response thereto, the first NMOS transistor N1 is turned on, and the second NMOS transistor N2 is turned off. The even bit line BLE is quickly precharged by the variable voltage VIRPWR of a power source voltage (VCC) level.

At this time, the even bit line selection signal SELBLE and the odd bit line selection signal SELBLO of a low level are inputted in order to prevent the even bit line and the odd bit line from being coupled with the first sense node SO1.

Further, the second sense node SO2 is precharged in response to the precharge control signal PRECHSO_N. The sense signal SENSE of a first voltage (V1) level is applied, thereby coupling the first and second sense nodes SO1, SO2 together.

After a lapse of some time, the voltage level of the variable voltage VIRPWR is changed into a ground voltage (VSS) level, the even discharge control signal DISCHE shifts to a low level, and the odd discharge control signal DISCHO shifts to a high level.

At the same time, the even bit line selection signal SELBLE shifts to a high level. Although the even bit line BLE has been precharged by the variable voltage VIRPWR, it has not yet been precharged to a desired target voltage. Accordingly, when the even bit line selection signal SELBLE of a high level is applied to turn on the third NMOS transistor N3, the even bit line BLE is precharged up to the target voltage by the voltage of the second sense node SO2.

Since the even bit line BLE can be quickly precharged according to the above method, a total bit line precharge time can be reduced.

Figure 4A:
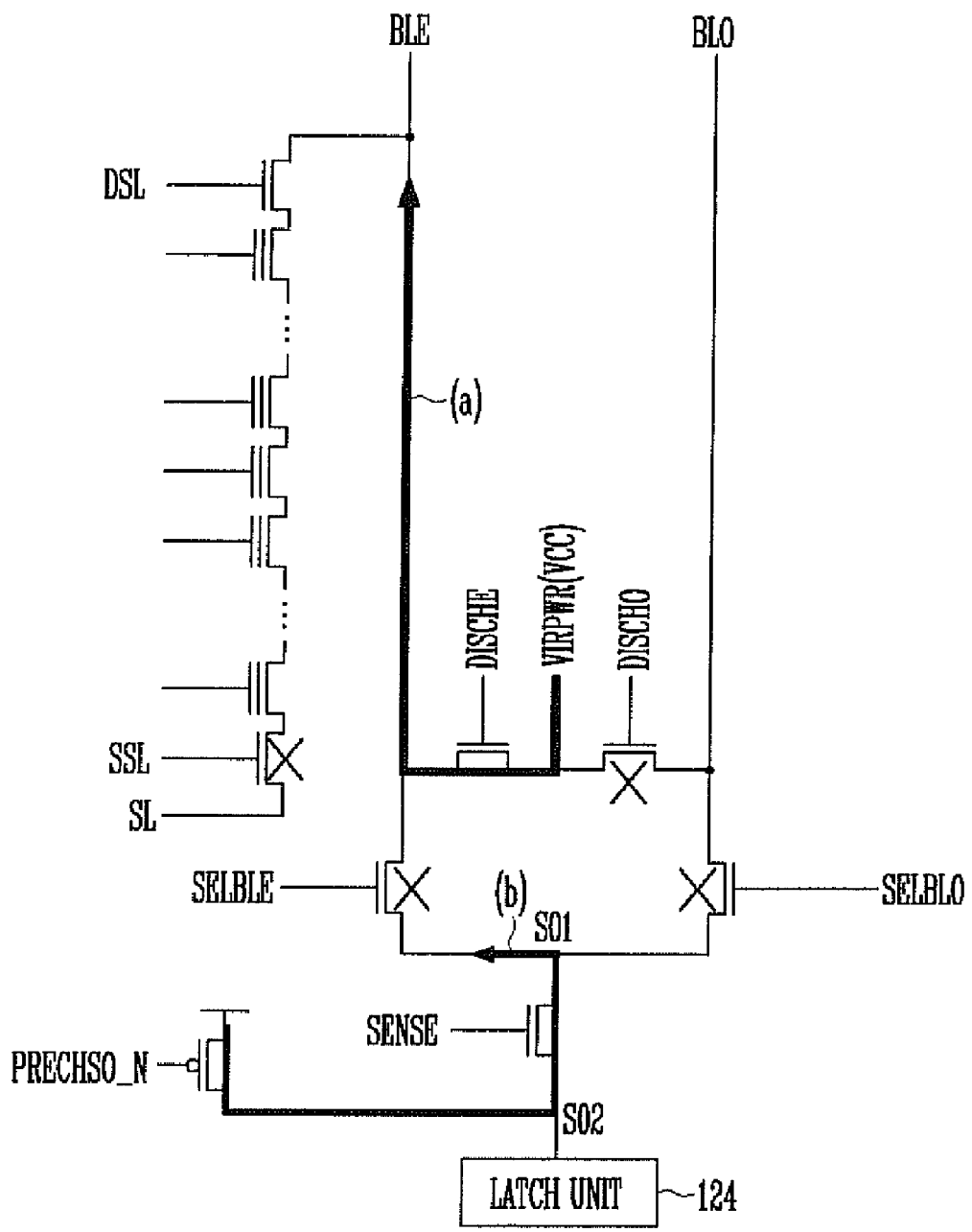
FIGS. 4A and 4B are diagrams illustrating a process of precharging a bit line according to a first embodiment of this disclosure.
Figure 4B:
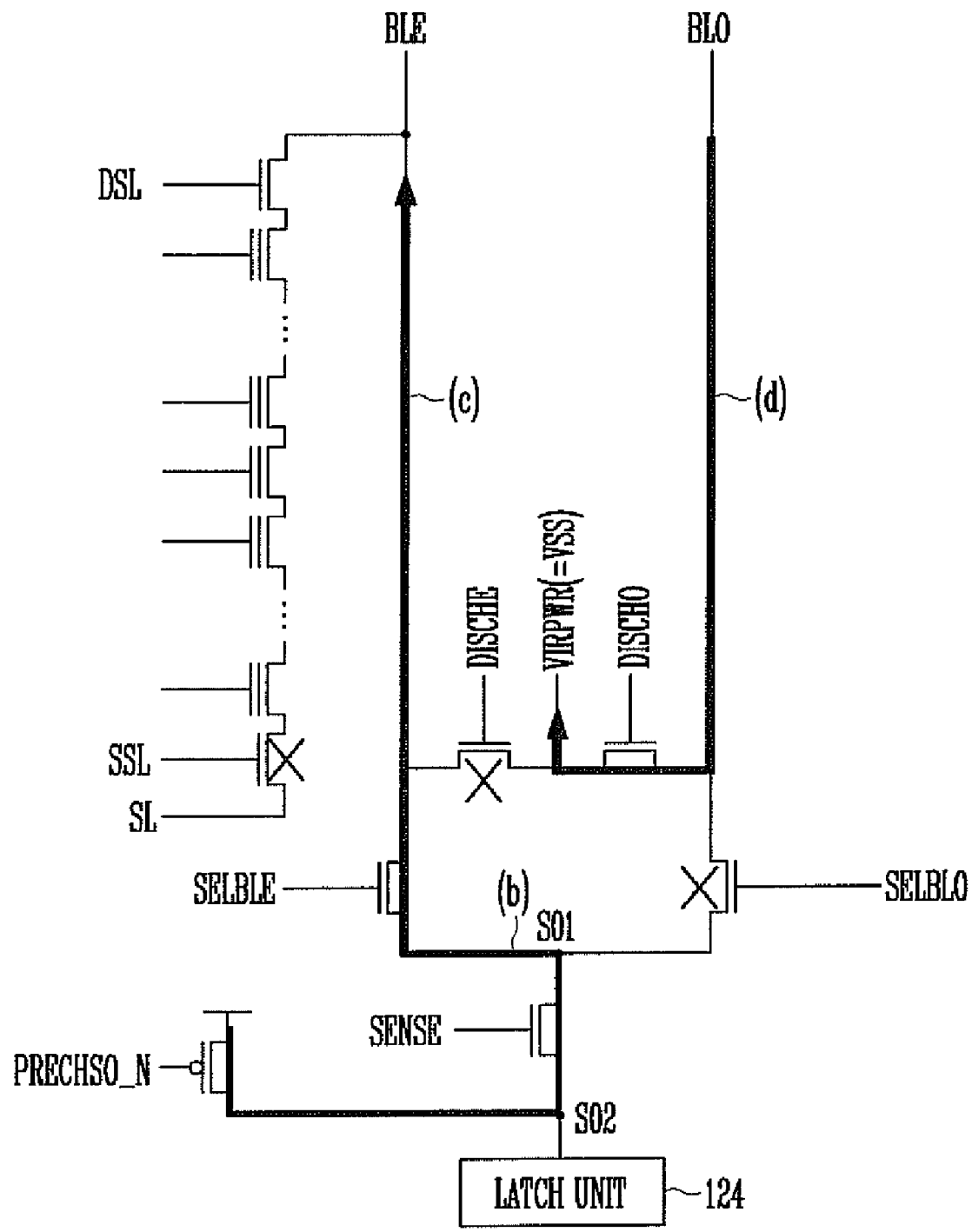

FIGS. 4A and 4B are diagrams illustrating a process of precharging a bit line according to a first embodiment of this disclosure.

FIG. 4A shows currents (a), (b) flowing while the even bit line is precharged during an over-driving time. That is, the even bit line is quickly precharged by the current 'a' according to the variable voltage VIRPWR of a power source voltage (VCC) level, but the current 'b' is not transferred to the even bit line because the third NMOS transistor N3 remains turned off.

Referring to FIG. 4B, after a lapse of some time, the variable voltage VIRPWR is changed to a ground voltage (VSS) level and coupled to the odd bit line BLO, so that a current (d) flows through the odd bit line BLO. Meanwhile, the even bit line BLE is precharged up to the target voltage by a current 'c' received via the second sense node SO2.

According to another embodiment, a bit line can be precharged using the following over-driving method.

Figure 5A:
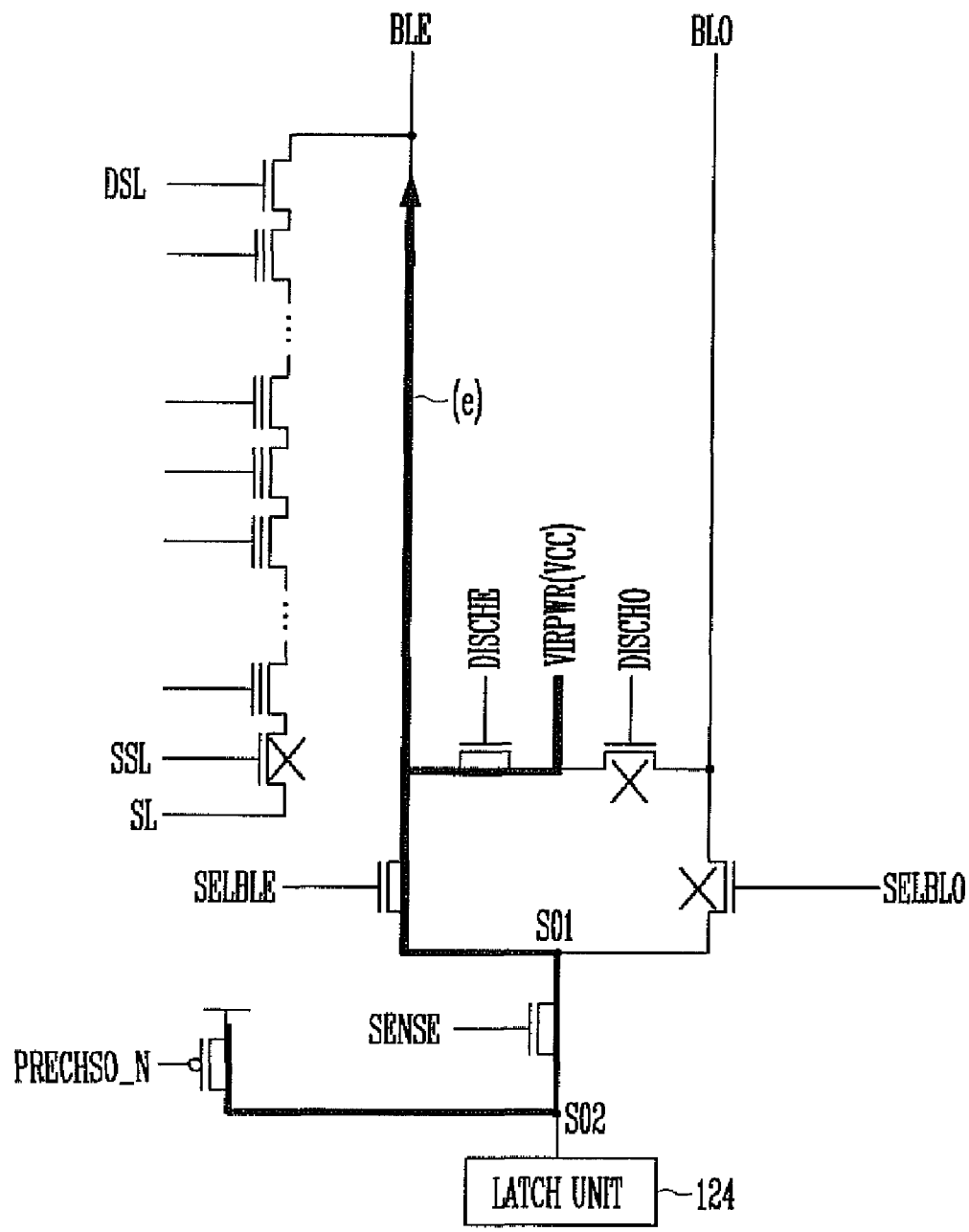
FIGS. 5A and 5B are diagrams illustrating a process of precharging a bit line according to a second embodiment of this disclosure.
Figure 5B:
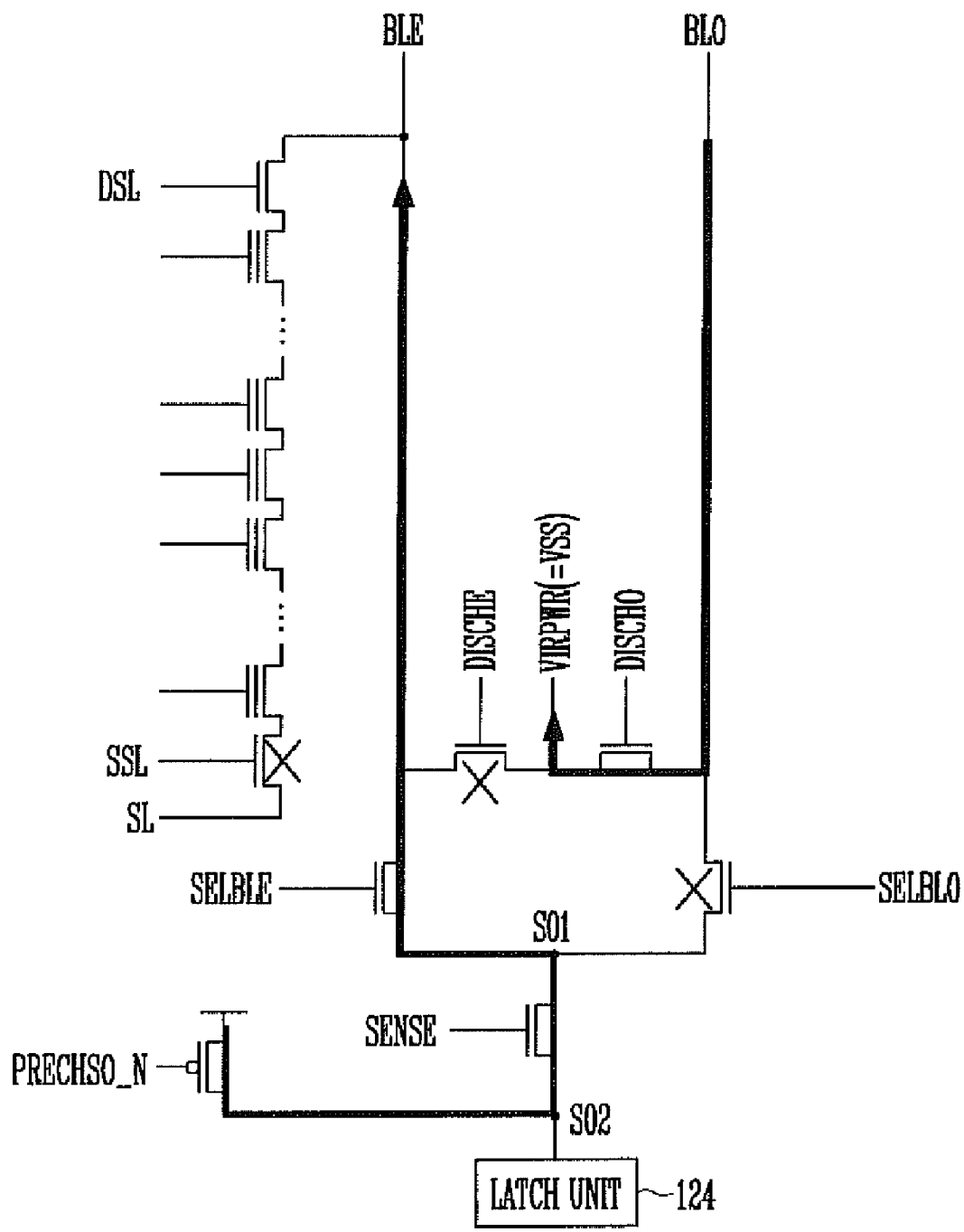

FIGS. 5A and 5B are diagrams illustrating a process of precharging a bit line according to a second embodiment of this disclosure.

Referring to FIGS. 5A and 5B, to precharge a bit line, the variable voltage VIRPWR of a power source voltage (VCC) level, the even discharge control signal DISCHE of a high level, and the odd discharge control signal DISCHO of a low level are inputted.

Furthermore, the even bit line selection signal SELBLE of a high level and the sense signal SENSE of a first voltage (V1) level are applied. Thus, a current (e) flows through the even bit line, such that the even bit line BLE is precharged by the variable voltage VIRPWR and the voltage of the second sense node SO2. Accordingly, the even bit line BLE can be more quickly precharged as compared with the case in which the even bit line is only precharged by the voltage of the second sense node SO2.

After a lapse of some time, the variable voltage VIRPWR is changed to a ground voltage (VSS) level, the even discharge control signal DISCHE shifts to a low level, and the odd discharge control signal DISCHO shifts to a high level.

When the odd discharge control signal DISCHO shifts to a high level, the second NMOS transistor N2 is turned on, and so the voltage level of the unselected odd bit line BLO is changed to a ground voltage (VSS) level.

However, the even bit line remains precharged through the second sense node SO2.

After the even bit line is precharged up to the target voltage according to the first or second embodiment of this disclosure as described above, the following data read operation is performed.

According to some exemplary embodiments, the even bit line can be precharged using the variable voltage VIRPWR for a portion of the time that the even bit line is being precharged by the voltage of the second sense node SO2. Then, the precharge of the even bit line can be completed using the voltage of the second sense node SO2.

Figure 6A:
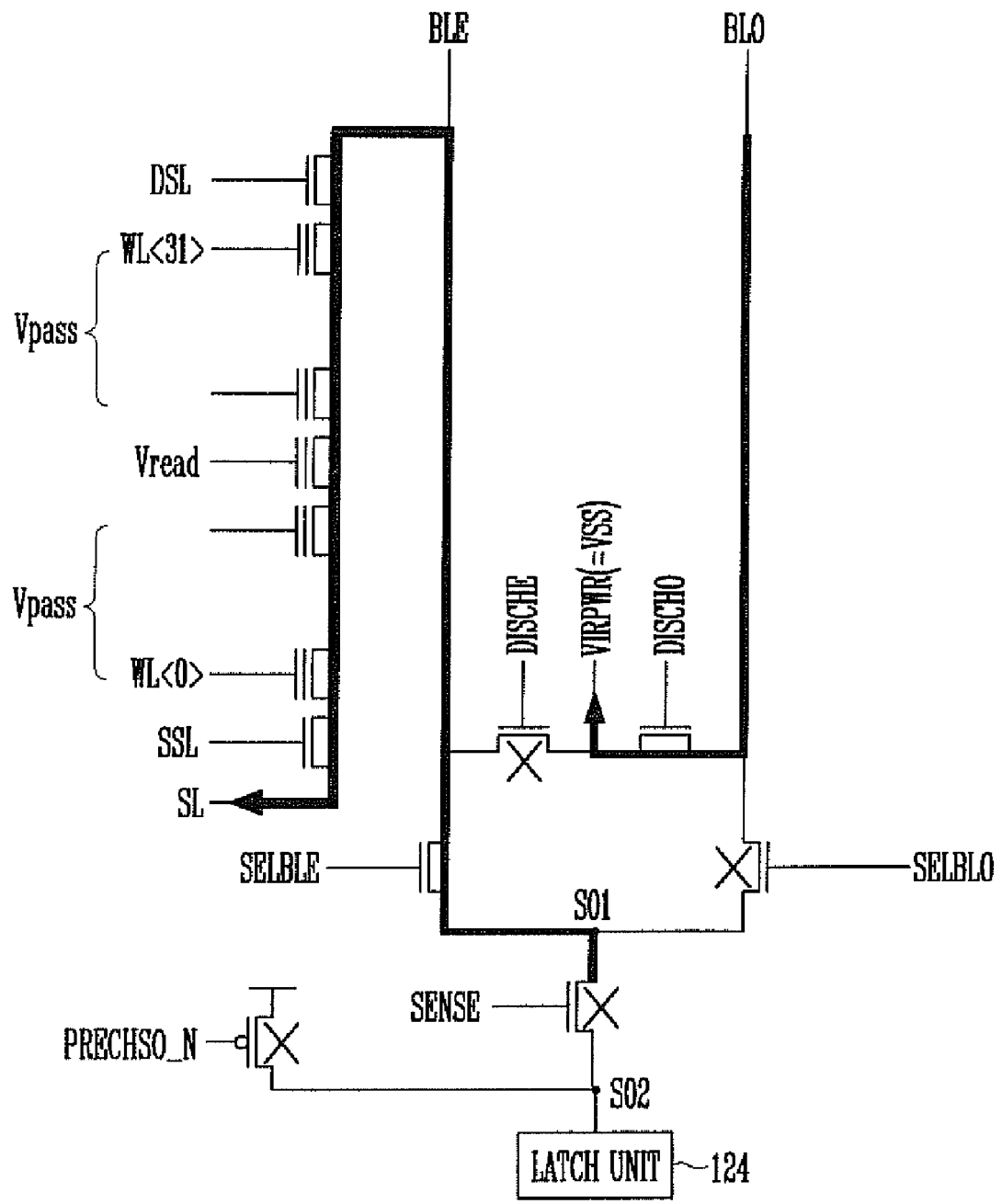
FIGS. 6A to 6C are diagrams illustrating a data read process after precharging a bit line.
Figure 6B:
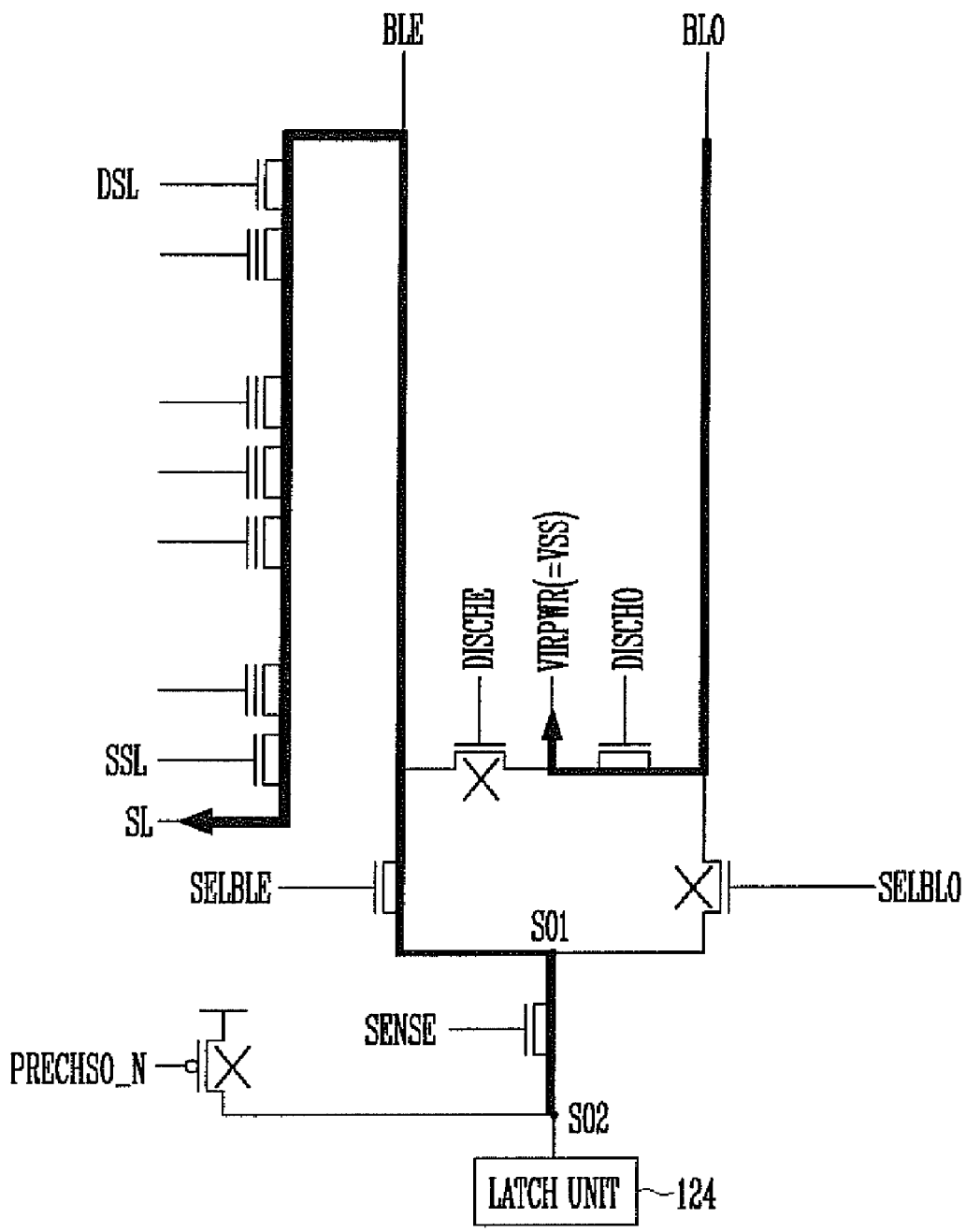
Figure 6C:
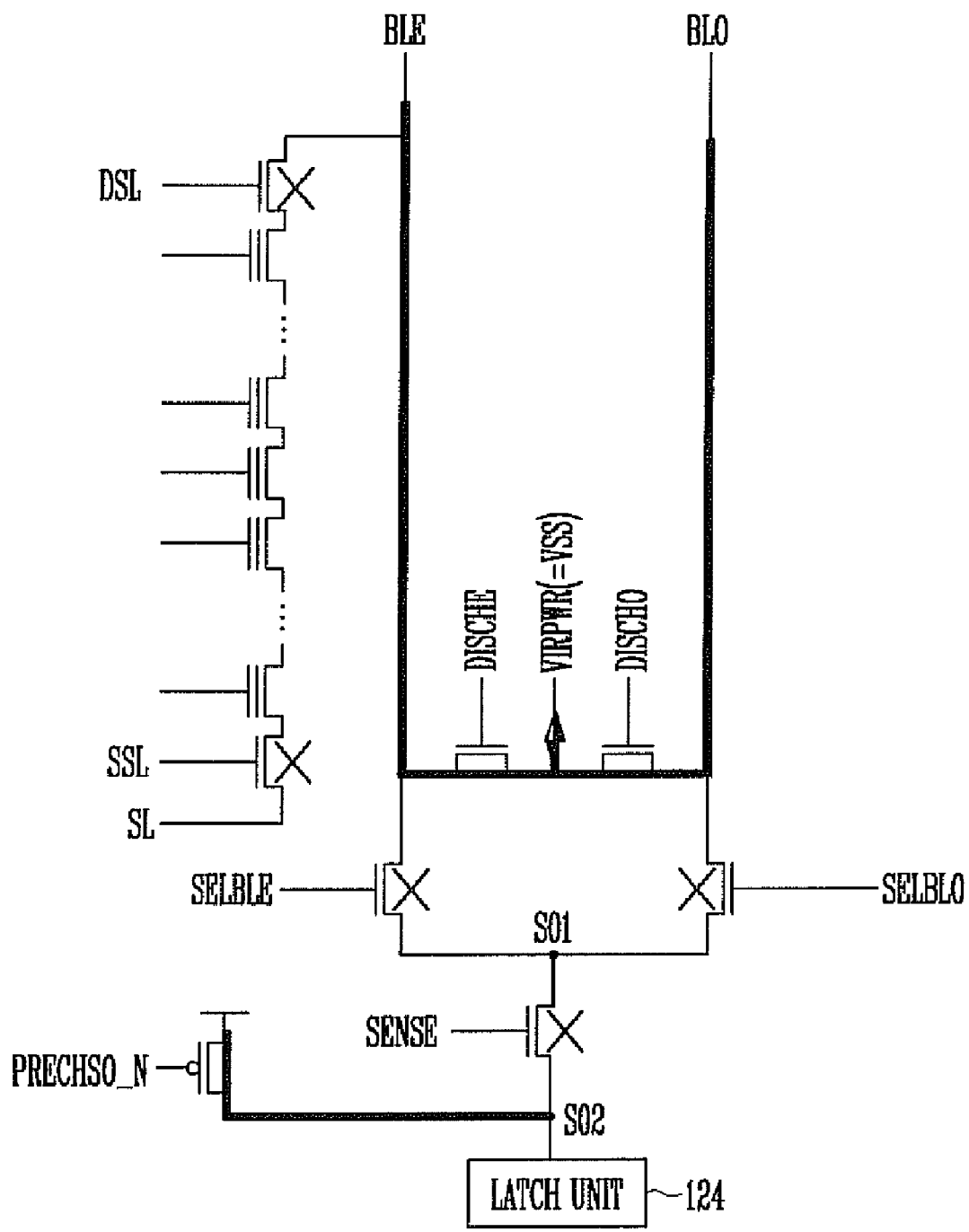

FIGS. 6A to 6C are diagrams illustrating a data read process after precharging a bit line. FIG. 6A is a diagram illustrating an evaluation process, FIG. 6B is a diagram illustrating a sense process, and FIG. 6C is a diagram illustrating a discharge process.

After the even bit line is precharged up to the target voltage according to the exemplary embodiments, the evaluation process is performed.

Referring to FIG. 6A, to perform the evaluation process, the sense signal SENSE shifts to a low level, and the bit line precharge process using the voltage of the second sense node SO2 is stopped. The voltage of the second sense node SO2 then drops to 0 V.

Further, the drain select transistor DST and the source select transistor SST are turned on. To read data, a read voltage Vread is applied to a selected word line, and a pass voltage Vpass is applied to the remaining word lines. The above-described state of the memory cell array remains intact during the evaluation process.

If the threshold voltage of a memory cell coupled to the selected word line is more than the read voltage Vread, the voltage of the even bit line is not changed. However, if the threshold voltage of the memory cell coupled to the selected word line is less than the read voltage Vread, the voltage of the bit line is changed to 0 V.

After the evaluation process is completed, the sense process is performed.

Referring to FIG. 6B, to sense data, the sense signal SENSE of a second voltage (V2) level is applied.

If, as a result of the evaluation process, the voltage of the even bit line remains in a precharged state, the fifth NMOS transistor N5 is turned on, and the voltage of the bit line is transferred to the second sense node SO2.

Accordingly, the second sense node SO2 shifts to a high level.

However, if, as a result of the evaluation process, the voltage of the even bit line changes to 0 V, the fifth NMOS transistor N5 is not turned on, and so the second sense node SO2 remains in a low level.

The latch unit 124 latches data according to the voltage level of the second sense node SO2.

After the data sense process is completed, the process of discharging voltage remaining in the even bit line is performed.

Referring to FIG. 6C, in the discharge process, the variable voltage VIRPWR has a ground voltage (VSS) level, and both the even discharge control signal DISCHE and the odd discharge control signal DISCHO shift to a high level. Thus, the voltage levels of the even and odd bit lines become a ground voltage level.

Accordingly, data are read through the above operation. Furthermore, in the program operation, the nonvolatile memory device performs a verification process similar to the data read process.

Accordingly, if the bit line precharge time is reduced using the variable voltage and the voltage of the sense node, not only can a data read time be reduced, but a program time can be reduced as well.

As described above, in the methods of operating the nonvolatile memory device according to this disclosure, a bit line is precharged by the variable voltage when data are read. Since the bit line can be quickly precharged as compared with the case in which the bit line is precharged using only a page buffer, a total data read time can be reduced, and so the performance can be improved. Furthermore, a program time can be reduced because the data read method of the present disclosure can be similarly applied to bit line precharging processes in a verification method.

What is claimed is:

1. A method of operating a nonvolatile memory device, comprising:
   providing page buffers each coupled to one or more bit lines;
   supplying a variable voltage of a first voltage level to a selected page buffer among the page buffers and supplying the variable voltage to a first bit line, coupled to a selected memory cell selected for data reading, for a first time period;
   cutting off the supply of the variable voltage to the first bit line, after the first time period, and precharging the first bit line to a second voltage level through a sense node of the selected page buffer, which is in a precharge state;
   evaluating a voltage of the first bit line, after the precharging of the first bit line, so that the voltage of the first bit line is shifted according to a program state of the selected memory cell; and
   sensing the voltage of the first bit line, after the evaluating of the voltage of the first bit line, and latching data in the selected memory cell.

2. The method of claim 1, further comprising cutting off the supply of the variable voltage to a second bit line unselected for data reading, during the first time period.

3. The method of claim 2, further comprising supplying the variable voltage of a ground voltage level and supplying the second bit line with the variable voltage, after the first time period.

4. The method of claim 2, further comprising disconnecting the sense node of the page buffer and the first bit line, during the first time period.

5. The method of claim 1, wherein the first voltage level is higher than the second voltage level.

6. A method of operating a nonvolatile memory device, comprising:
   providing page buffers each coupled to one or more bit lines;
   precharging a sense node of one of the page buffers, coupling the sense node to a first bit line to which a selected memory cell selected for data reading is coupled, and precharging the first bit line coupled to the sense node and simultaneously supplying the first bit line with a variable voltage of a first voltage level for a first time period, thereby obtaining a precharged first bit line having a second voltage level;
   evaluating a voltage of the precharged first bit line, so that the voltage of the precharged first bit line is shifted according to a program state of the selected memory cell; and
   sensing the voltage of the precharged first bit line, after the evaluating of the voltage of the precharged first bit line, and latching data in the selected memory cell.

7. The method of claim 6, wherein the first time period is shorter than a time period utilized for the precharging of the first bit line.

8. The method of claim 6, wherein the variable voltage is supplied when the precharging of the first bit line is started, and the supplying of the variable voltage is stopped after a lapse of the first time period.

9. The method of claim 6, wherein after a lapse of a certain time since the precharging of the bit line is started, the supply of the variable voltage begins.

10. The method of claim 6, further comprising changing the variable voltage to a ground voltage level and supplying the variable voltage of the ground voltage level to a second bit line unselected for data reading, after the first time period.

11. The method of claim 6, wherein the first voltage level is higher than the second voltage.

* * * * *